(12) United States Patent
Motohara

(10) Patent No.: US 8,385,081 B2
(45) Date of Patent: Feb. 26, 2013

(54) STACKED MOUNTING STRUCTURE

(75) Inventor: Hiroyuki Motohara, Hachioji (JP)

(73) Assignee: Olympus Corporation, Tokyo (JP)

( * ) Notice: Subject to any disclaimer, the term of this patent is extended or adjusted under 35 U.S.C. 154(b) by 265 days.

(21) Appl. No.: 12/840,432

(22) Filed: Jul. 21, 2010

(65) Prior Publication Data

US 2010/0284161 A1 Nov. 11, 2010

Related U.S. Application Data

(63) Continuation of application No. PCT/JP2009/000089, filed on Jan. 13, 2009.

(30) Foreign Application Priority Data

Jan. 22, 2008 (JP) ................................. 2008-011582

(51) Int. Cl.
*H05K 1/11* (2006.01)
*H05K 1/14* (2006.01)

(52) U.S. Cl. ......................... 361/792; 361/726; 361/774

(58) Field of Classification Search .................. 361/726, 361/760, 792, 794, 770–774, 790; 257/737–738, 257/678, 688
See application file for complete search history.

(56) References Cited

U.S. PATENT DOCUMENTS

| | | | |
|---|---|---|---|
| 4,956,694 A * | 9/1990 | Eide ............................. | 257/686 |
| 5,174,763 A * | 12/1992 | Wilson .......................... | 439/66 |
| 5,491,304 A * | 2/1996 | Kei Lau et al. ................ | 174/264 |
| 6,597,582 B2 * | 7/2003 | Baba ............................. | 361/760 |
| 6,998,926 B2 * | 2/2006 | Miyazaki et al. .............. | 331/68 |
| 7,276,792 B2 * | 10/2007 | Tanaka et al. .................. | 257/737 |
| 7,557,445 B2 * | 7/2009 | Choi et al. ..................... | 257/748 |
| 7,649,740 B2 * | 1/2010 | Sekido .......................... | 361/735 |
| 7,876,573 B2 * | 1/2011 | Motohara et al. ............. | 361/790 |
| 8,077,478 B2 * | 12/2011 | Takatori et al. ............... | 361/793 |

FOREIGN PATENT DOCUMENTS

| | | |
|---|---|---|
| JP | 2000-294720 | 10/2000 |
| JP | 2001-111232 | 4/2001 |
| JP | 2004-007469 | 1/2004 |
| JP | 2005-5092 | 1/2005 |
| WO | WO 2006/098364 A1 | 9/2006 |

OTHER PUBLICATIONS

International Search Report dated May 12, 2009.
International Preliminary Report on Patentability together with the Written Opinion dated Aug. 31, 2010.

* cited by examiner

*Primary Examiner* — Hung S Bui
(74) *Attorney, Agent, or Firm* — Scully Scott Murphy & Presser, PC

(57) ABSTRACT

A stacked mounting structure includes a first substrate which includes a first electronic component, a second substrate disposed facing the first substrate and including a second electronic component, an intermediate member having a space for accommodating the second electronic component, an electroconductive member provided to the intermediate member, a first electrode for testing electrically connected to the first electronic component, as an electrode for testing an operation of the first electronic component, a connecting electrode toward the second substrate electrically connected to the second electronic component, as an electrode for electrically connecting to the electroconductive member, and a second electrode for testing provided to the first substrate as an electrode for testing an operation of the second electronic component and electrically connected to the second electronic component via the electroconductive member and the connecting electrode toward the second substrate.

12 Claims, 18 Drawing Sheets

100

STACKED MOUNTING STRUCTURE

CROSS-REFERENCE TO RELATED APPLICATIONS

The present application is based upon and claims the benefit of priority from prior Japanese Patent Application No. 2008-011582 filed on Jan. 22, 2008; the entire contents of which are incorporated herein by reference.

TECHNICAL FIELD

The present invention relates to a stacked mounting structure which is provided with an electrode for testing.

BACKGROUND ART

A stacked mounting structure which is used in a cellular phone described in Patent Literature 1 (Japanese Patent Application Laid-open Publication No. 2004-7469) can be cited as a conventional example of the stacked mounting structure which is provided with an electrode for testing. The stacked mounting structure (electronic component 410) in Patent Literature 1 is a stacked mounting structure having a component (an integrated circuit 415) accommodated at an interior, and substrates 441 to 445 stacked, and by providing the electrode for testing (terminal for testing 431) on one surface 430 other than a mounting surface 420, testing after formation of the stacked mounting structure can be carried out easily (FIG. 18).
Patent Literature 1: Japanese Patent Application Laid-open Publication No. 2004-7469

DISCLOSURE OF THE INVENTION

Problems to be Solved by the Invention

However, in the abovementioned stacked mounting structure 410, testing of each of the layers 441 to 445 of the stacked mounting structure 410 could not be carried out individually after the stacked mounting structure 410 has been formed. Therefore, in the conventional technology, since it is not possible to test an independent function of each layer forming the stacked mounting structure 410, identification of a location of a defect when a defect has occurred in the stacked mounting structure 410 has been difficult. Furthermore, even when only a part of the layers forming the stacked mounting structure is defective, as the entire stacked mounting structure including the other layers without any defect is considered to be defective, it leads to a degradation of yield. Particularly, when each layer forming the stacked mounting structure 410 is an expensive member, there is a substantial effect on cost. Furthermore, when functions of the stacked mounting structure 410 are complicated, since testing of all functions of the stacked mounting structure 410 which have been collectively complicated after the formation of the stacked mounting structure 410 is to be carried out, the testing becomes complicated, thereby leading to a degradation of reliability of testing.

The present invention has been made in view of the abovementioned circumstances, and an object of the present invention is to provide a stacked mounting structure in which, it is possible to carryout testing of each substrate after the formation of (after manufacturing) the stacked mounting structure.

Means for Solving the Problems

To solve the abovementioned problems and to achieve the object, a stacked mounting structure according to the present invention includes a first substrate which includes a first electronic component, a second substrate which is disposed facing the first substrate, and which includes a second electronic component, an intermediate member which his installed between the first substrate and the second substrate, and which connects the first substrate and the second substrate, leaving a predetermined distance, and which has a space for accommodating the second electronic component, an electroconductive member which is provided to the intermediate member, a first electrode for testing which is an electrode which is provided to the first substrate, as an electrode for testing an operation of the first electronic component, and which is electrically connected to the first electronic component, a connecting electrode toward the second substrate which is provided to the second substrate as an electrode for electrically connecting to the electroconductive member, and which is electrically connected to the second electronic component, and a second electrode for testing which is an electrode which is provided to the first substrate, as an electrode for testing an operation of the second electronic component, and which is electrically connected to the second electronic component via the electroconductive member and the connecting electrode toward the second substrate.

In the stacked mounting structure according to the present invention, it is preferable that the connecting electrode toward the second substrate, in a state of the second substrate not connected to the intermediate member, functions as an electrode for testing an operation of the second component.

In the stacked mounting structure according to the present invention, it is preferable that the first substrate includes a third electrode for testing which is electrically connected to the first electronic component, the second electronic component, and all other electronic components, as an electrode for testing an operation of the first electronic component, the second electronic component, and all other electronic components.

In the stacked mounting structure according to the present invention; it is preferable that the first electrode for testing and the second electrode for testing are provided on one surface of the first substrate.

In the stacked mounting structure according to the present invention, it is preferable that the third electrode for testing is provided on a same surface as the one surface of the first substrate.

In the stacked mounting structure according to the present invention, it is preferable that one surface of the first substrate is a surface which is positioned on an opposite side of a surface facing the second substrate.

In the stacked mounting structure according to the present invention, it is desirable that the stacked mounting structure includes a connecting electrode toward the first substrate which is an electrode provided to a surface of the first substrate facing the intermediate member, as an electrode for electrically connecting to the electroconductive member, and that one end portion of the electroconductive member makes a direct contact with the connecting electrode toward the first substrate, and the other end portion of the electroconductive member makes a direct contact with the connecting electrode toward the second substrate.

In the stacked mounting structure according to the present invention, it is preferable to provide the electroconductive member inside a through hole which is formed in the intermediate member.

In the stacked mounting structure according to the present invention, it is preferable to provide the electroconductive member inside a recess which is formed in the intermediate member.

In the stacked mounting structure according to the present invention, each electrode for testing can be made of a plurality of electrodes, and at least one of the predetermined electrodes for testing can serve also a function of at least one of the other electrodes for testing.

In the stacked mounting structure according to the present invention, it is preferable that the electrodes for testing which serve the same function are used as a ground terminal, a power supply terminal, or a signal-line terminal.

In the stacked mounting structure according to the present invention, it is preferable that all electrodes for testing have same area.

Effects of the Invention

A stacked mounting structure according to the present invention includes
- a first substrate which includes a first electronic component,
- a second substrate which is disposed facing the first substrate, and which includes a second electronic component,
- an intermediate member which is installed between the first substrate and the second substrate, and which connects the first substrate and the second substrate, leaving a predetermined distance, and which has a space for accommodating the second electronic component,
- an electroconductive member which is provided to the intermediate member,
- a first electrode for testing which is an electrode which is provided to the first substrate, as an electrode for testing an operation of the first electronic component, and which is electrically connected to the first electronic component,
- a connecting electrode toward the second substrate which is provided to the second substrate, as an electrode for electrically connecting to the electroconductive member, and which is electrically connected to the second electronic component, and
- a second electrode for testing which is an electrode which is provided to the first substrate, as an electrode for testing an operation of the second electronic component, and which is electrically connected to the second electronic component via the electroconductive member and the connecting electrode toward the second substrate. Accordingly, testing of each substrate after the formation of (after manufacturing) the stacked mounting structure is possible. Consequently, there are effects that (1) it is possible to identify a location of a defect in substrates after the formation of the stacked mounting structure, and an improvement in quality can be anticipated, (2) since it is not necessary to keep an electrode for testing the second substrate to be exposed to outside, a degree of freedom of designing is widened, and also, a small-sizing of the stacked mounting structure becomes possible.

In the stacked mounting structure of the present invention, the first electrode for testing and the second electrode for testing are provided on the same surface of the first substrate. Or, since the third electrode for testing is provided on the same surface as the one surface of the first substrate (the surface on which the first electrode for testing and the second electrode for testing have been provided), probes for testing can make an access from one direction. Therefore, the testing becomes easy and shortening of testing time can be anticipated.

In the stacked mounting structure according to the present invention, by letting the one surface of the first substrate to be a surface positioned on the opposite side of the surface facing the second surface, the probes for testing can make an access in a direction perpendicular to the first substrate, and it is possible to reduce a possibility of a damage of the stacked mounting structure due to an access by the probes for testing.

In the stacked mounting structure according to the present invention, each electrode for testing is made of a plurality of electrodes, and by at least one of the predetermined electrodes for testing serving also a function of at least one of the other electrodes for testing, the plurality of electrodes for testing can be used as one electrode for testing. Therefore, it is possible to reduce the number of probes necessary for testing.

In the stacked mounting structure according to the present invention, as the electrodes for testing which serve the same function are used as a ground terminal, a power supply terminal, or a signal-line terminal, the ground, the power supply line, or the signal line which used to be separated can be formed by one ground, power supply line, or the signal line, and accordingly, the ground, the power supply line, or the signal line can be anticipated to be stabilized electrically.

In the stacked mounting structure according to the present invention, since all electrodes for testing have the same area, the plurality of electrodes for testing can be formed by the area of one electrode for testing. Therefore, small-sizing of the stacked mounting structure can be anticipated.

Figure 1:
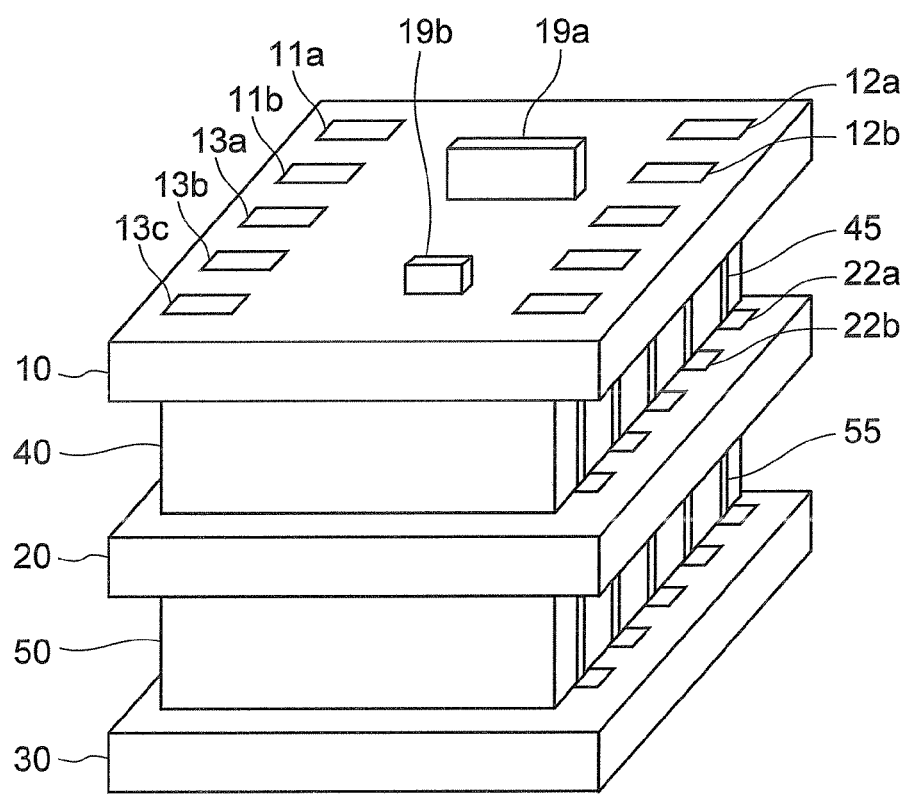
FIG. 1 is a perspective view showing a structure of a stacked mounting structure according to a first embodiment.

DESCRIPTION OF REFERENCE NUMERALS 10 first substrate
10a opposite surface
11a 11b first electrodes for testing
12a 12b second electrodes for testing
13a 13b 13c electrodes for testing stacked mounting structure
16 protruding electrode
19a 19b electronic components
20 second substrate
20a mounting surface
22a 22b connecting electrodes toward second substrate
26 protruding electrode
29a, 29b, 29c electronic components
30 third substrate
40 intermediate member
45 electroconductive member
46 through hole
47 electroconductive member
48 groove
49 electroconductive member
50 intermediate member
55 electroconductive member
61a 61b probes for testing
62a 62b probes for testing
63a, 63b, 63c probes for testing
100 200 stacked mounting structures
310 first substrate
311a 311b first electrodes for testing
312a 312b second electrodes for testing
313b 313c third electrodes for testing

BEST MODE FOR CARRYING OUT THE INVENTION

Embodiments of a stacked mounting structure according to the present invention will be described below in detail with reference to the accompanying diagrams. However, the present invention is not restricted to the embodiments described below.

First Embodiment

Figure 2:
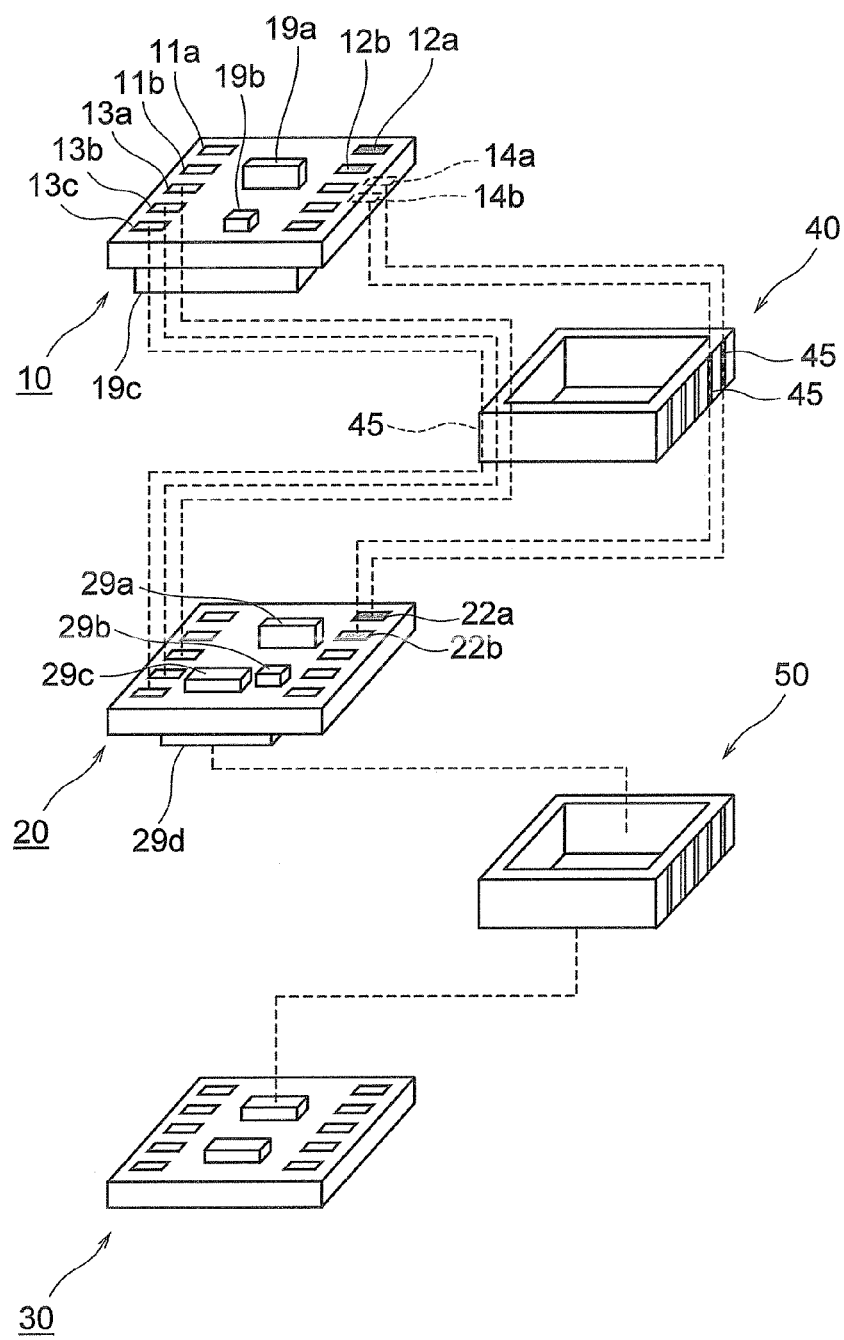
FIG. 2 is an exploded perspective view showing a structure of the stacked mounting structure according to the first embodiment.

A stacked mounting structure 100 according to a first embodiment will be described below while referring to diagrams from FIG. 1 to FIG. 15. FIG. 1 and FIG. 2 show a structure in which, three substrates 10, 20, and 30 are stacked via two intermediate members 40 and 50. For simplifying the description, the description will be made by citing an example of a relationship of a first substrate 10, the intermediate member 40, and a second substrate 20.

Figure 3:
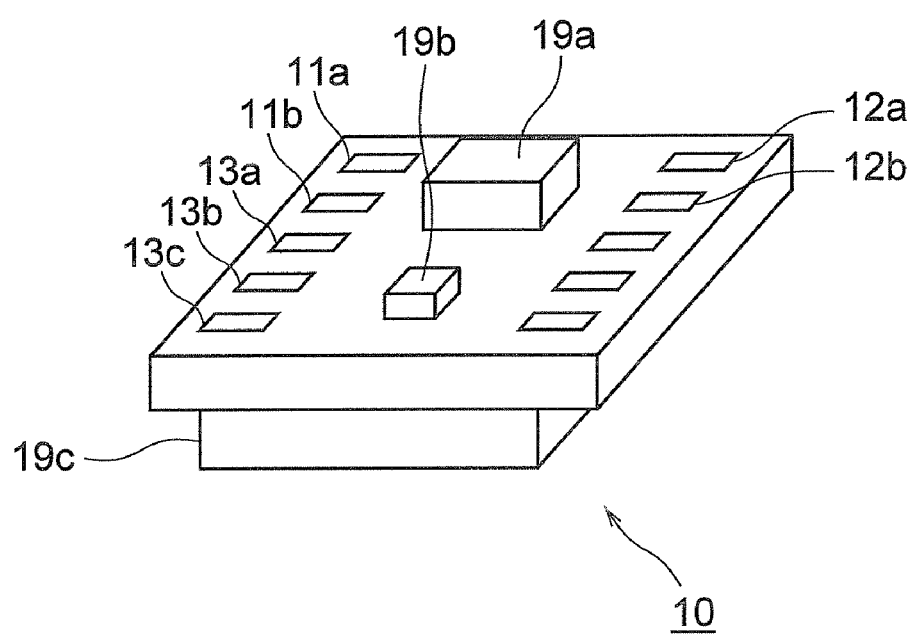
FIG. 3 is a perspective view showing a structure of a first substrate according to the first embodiment.
Figure 4:
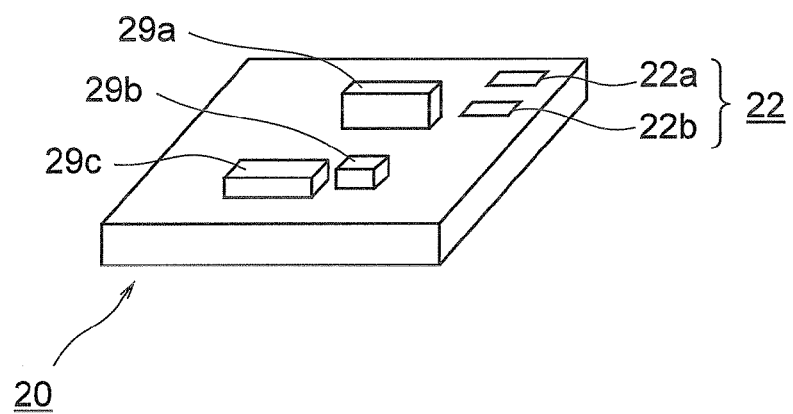
FIG. 4 is a perspective view showing a structure of a second substrate according to the first embodiment.

First electrodes for testing 11a and 11b, second electrodes for testing 12a and 12b, and electrodes for testing the stacked mounting structure 13a, 13b, and 13c are provided on the first substrate 10, and electronic components 19a, 19b, and 19c are mounted on the first substrate 10 (FIG. 3). Connecting electrodes toward second substrate 22a and 22b are provided on the second substrate 20, and electronic components 29a, 29b, and 29c are mounted on the second substrate 20 (FIG. 4). Here, FIG. 3 is a perspective view showing a structure of the first substrate 10, and FIG. 4 is a perspective view showing a structure of the second substrate 20.

Figure 5:
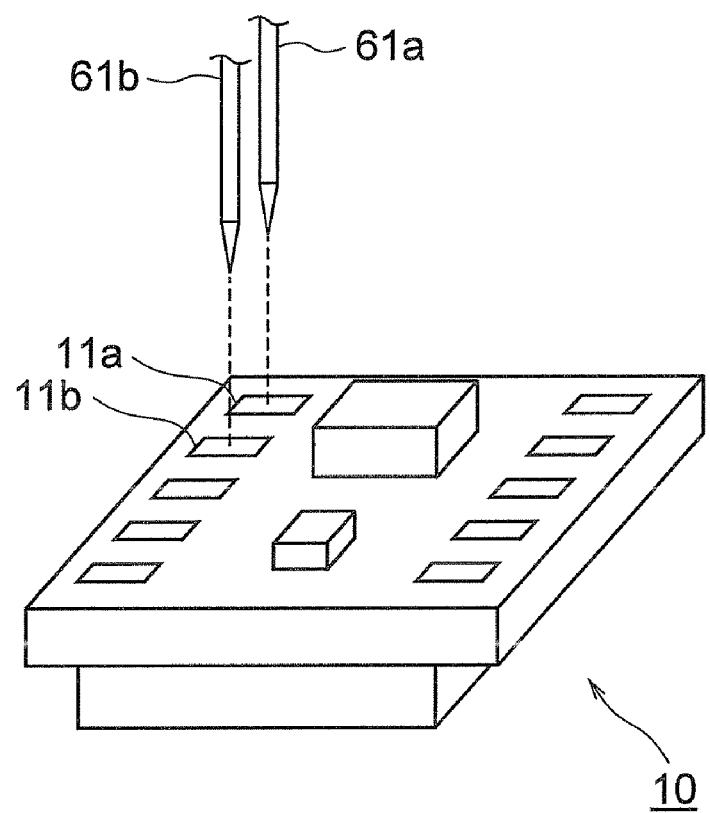
FIG. 5 is a perspective view showing a relationship of probes for testing and the first substrate according to the first embodiment.
Figure 6:
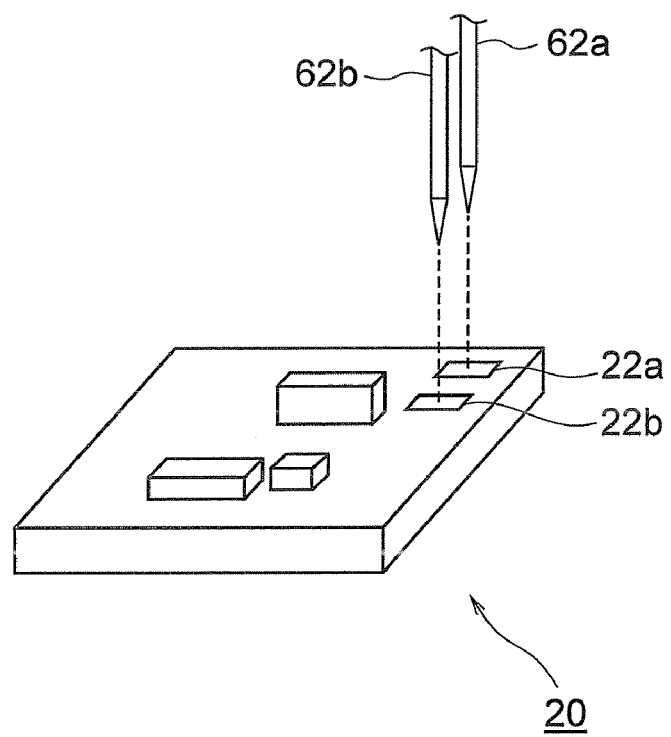
FIG. 6 is a perspective view showing a relationship of the probes for testing and the second substrate according to the first embodiment.
Figure 8:
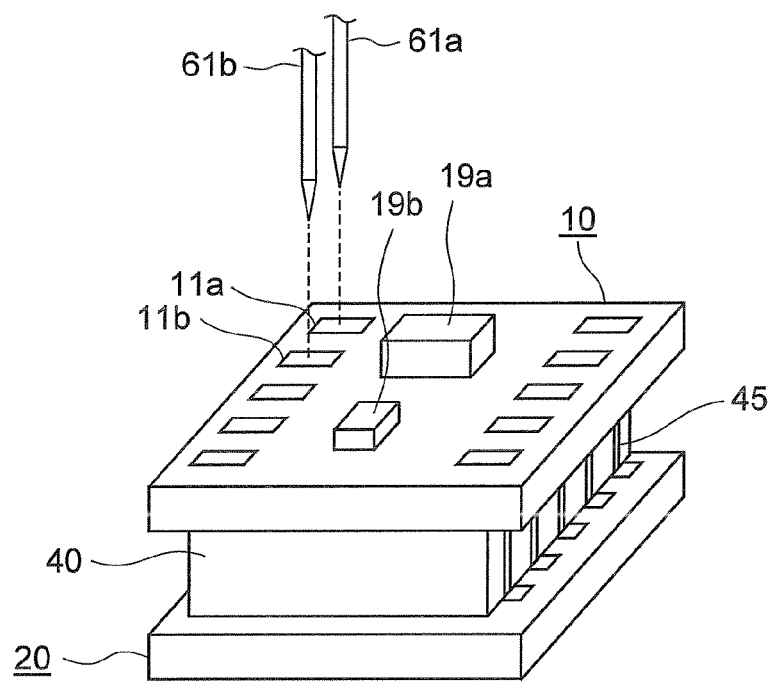
FIG. 8 is a perspective view showing a relationship of the probes for testing and the stacked mounting structure at the time of testing the first substrate in the stacked mounting structure after manufacturing.
Figure 9:
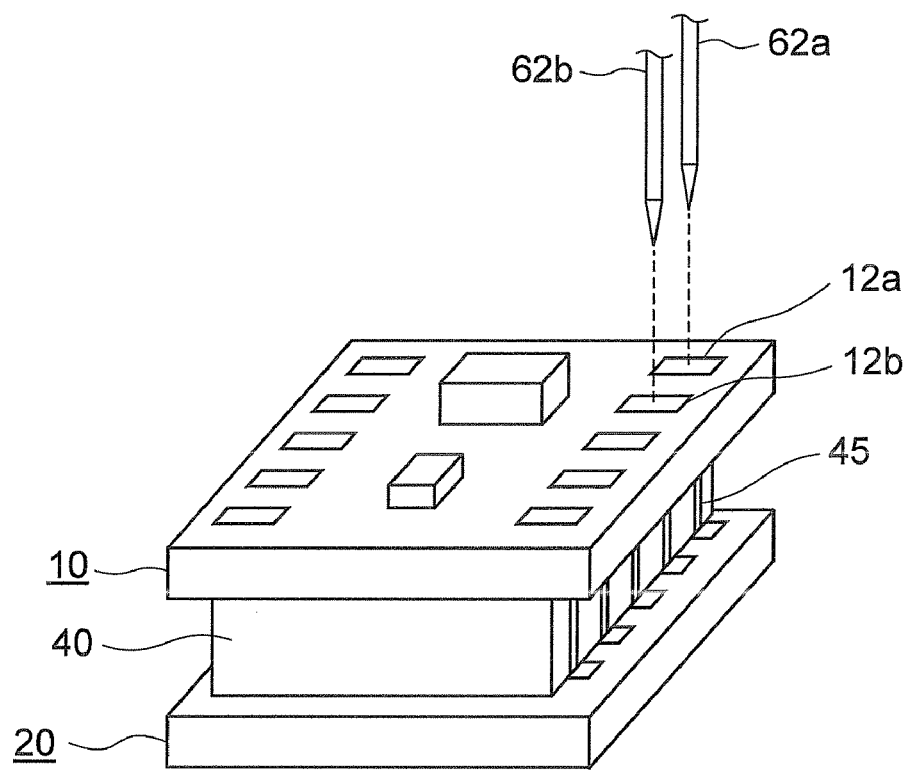
FIG. 9 is a perspective view showing a relationship of the probes for testing and the stacked mounting structure at the time of testing the second substrate in the stacked mounting structure after manufacturing.

The first electrodes for testing 11a and 11b are electrically connected to the electronic components 19a, 19b, and 19c, and by bringing probes for testing 61a and 61b in contact, checking of operation of the first substrate 10 on which the electronic components 19a, 19b, and 19c are mounted is carried out (FIG. 5 and FIG. 8). Moreover, connecting electrodes toward the second substrate 22a and 22b are electrically connected to the electronic components 29a, 29b, and 29c, and by bringing probes for testing 62a and 62b in contact, checking of operation of the second substrate 20 on which, the electronic components 29a, 29b, and 29c are mounted is carried out (FIG. 6 and FIG. 9). Here, FIG. 5 is a diagram showing a relationship of the probes for testing 61a and 61b and the first substrate 10 at the time of checking the operation of the first substrate 10, before manufacturing the stacked mounting structure 100.

FIG. 6 is a diagram showing a relationship of the probes for testing 62a and 62b of the second substrate 20 at the time of checking an operation of the second substrate 20 before manufacturing the stacked mounting structure 100. FIG. 7A, FIG. 7B, and FIG. 7C are perspective views showing a process of manufacturing the stacked mounting structure 100, where, FIG. 7A at left shows a state before assembling, FIG. 7B at center shows a state after assembling, and FIG. 7C at right shows a state after disposing the electroconductive member. FIG. 8 is a diagram showing a relationship of the probes for testing 61a and 61b and the first substrate 10 at the time of checking the operation of the first substrate 10 after manufacturing the stacked mounting structure 100. FIG. 9 is a diagram showing a relationship of the probes for testing 62a and 62b and the second substrate 20 at the time of checking the operation of the second substrate 20 after manufacturing the stacked mounting structure 100.

The first substrate 10 on which, the electronic components 19a, 19b, and 19c are mounted and the second substrate 20 on which, the electronic components 29a, 29b, and 29c are mounted are connected by an adhesive etc. via the intermediate member 40 in which the electronic components 29a, 29b, and 29c can be accommodated. An electroconductive member 45 is formed by applying and sintering a liquid containing electroconductive particles for example by a dispense method, on a wall surface of the intermediate member 40. Accordingly, the stacked mounting structure 100 in which the first substrate 10 and the second substrate 20 are connected electrical potentially is formed.

Figure 7:
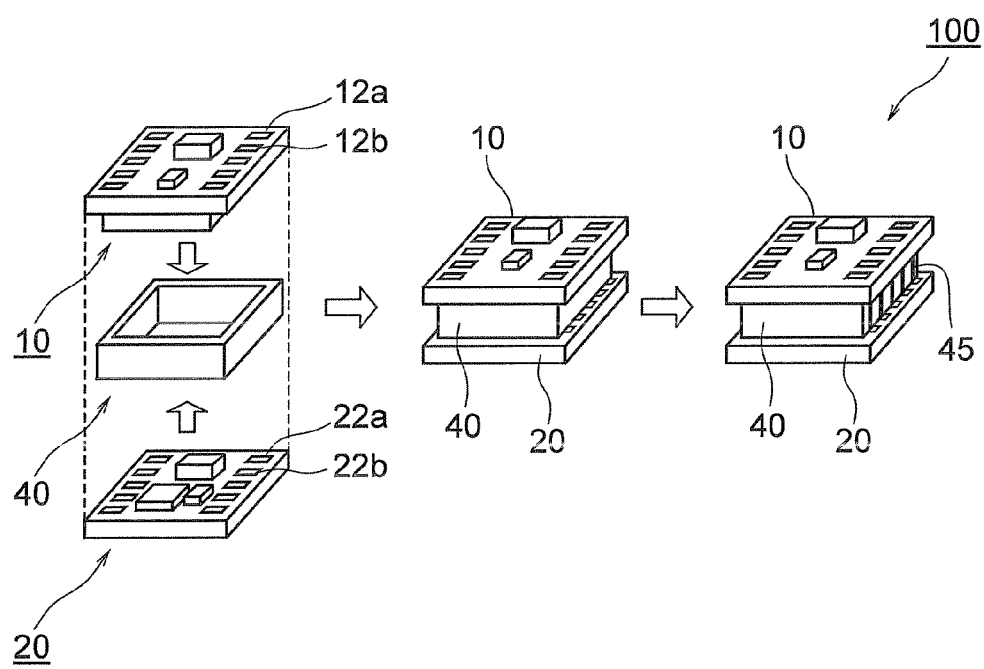
FIG. 7A, FIG. 7B, and FIG. 7C are perspective views showing a process of manufacturing the stacked mounting structure according to the first embodiment.
Figure 11:
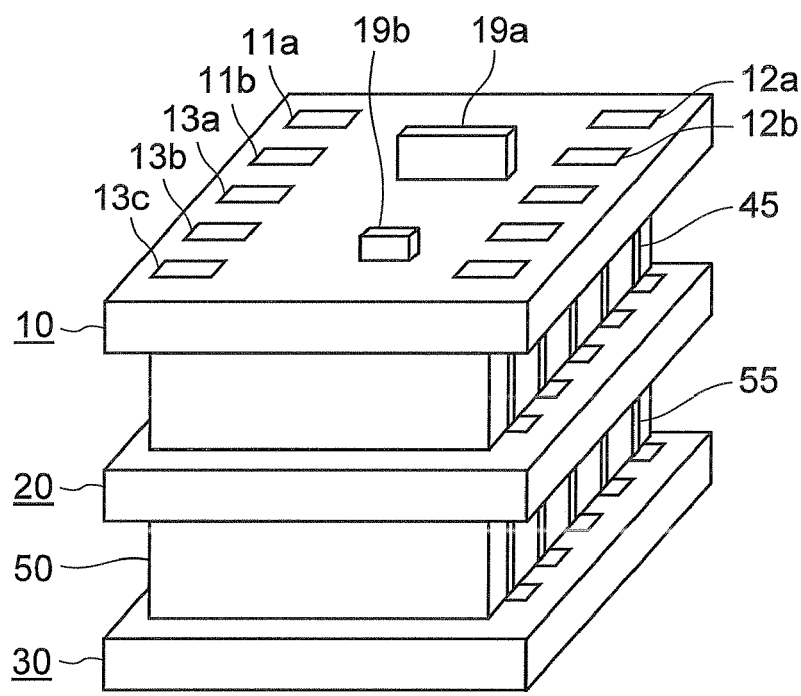
FIG. 11 is a perspective view showing an example of a stacked mounting structure having three or more layers.

At this time, the connecting electrodes toward the second substrate 22a and 22b provided on the second substrate 20 are electrically connected to the second electrodes for testing 12a and 12b provided on the first substrate 10 via the electroconductive member 45 formed on the wall surface toward the intermediate member 40 (FIG. 2 and FIG. 7). In a case of connecting the second substrate 20 and the third substrate 30 electrical potentially via the intermediate member 50, it is preferable to provide an electroconductive member 55 similarly as the electroconductive member 45, also to the intermediate electrode 50 (FIG. 1 and FIG. 11). Here, FIG. 11 is a perspective view showing an example of a stacked mounting structure in which three or more substrates are stacked.

Figure 13:
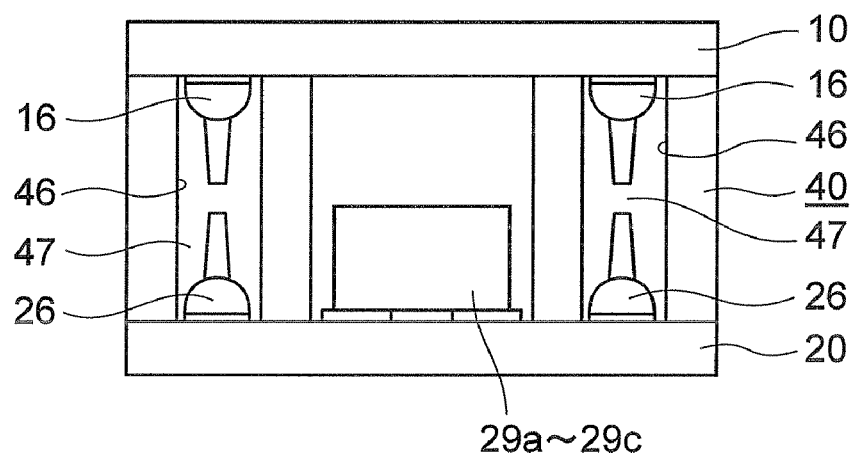
FIG. 13 is a cross-sectional view taken along a line XIII-XIII in FIG. 12.
Figure 14:
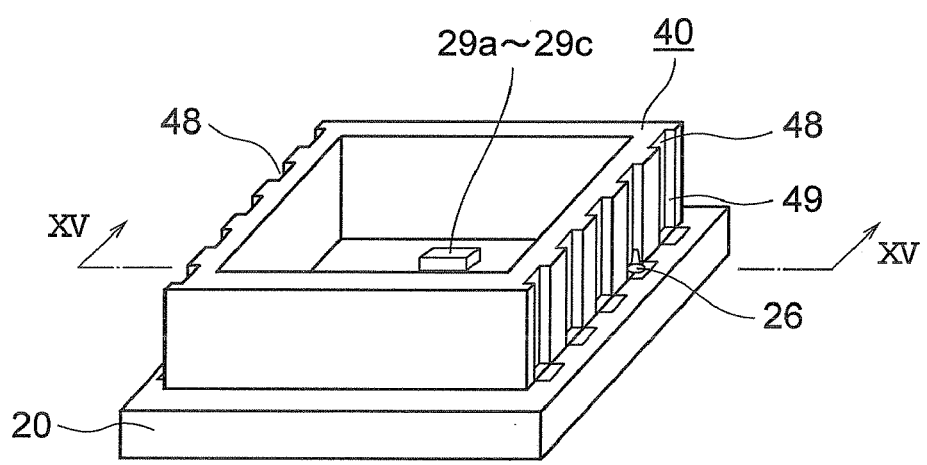
FIG. 14 is a perspective view showing a structure of the electroconductive member and a groove formed in the intermediate member.
Figure 15:
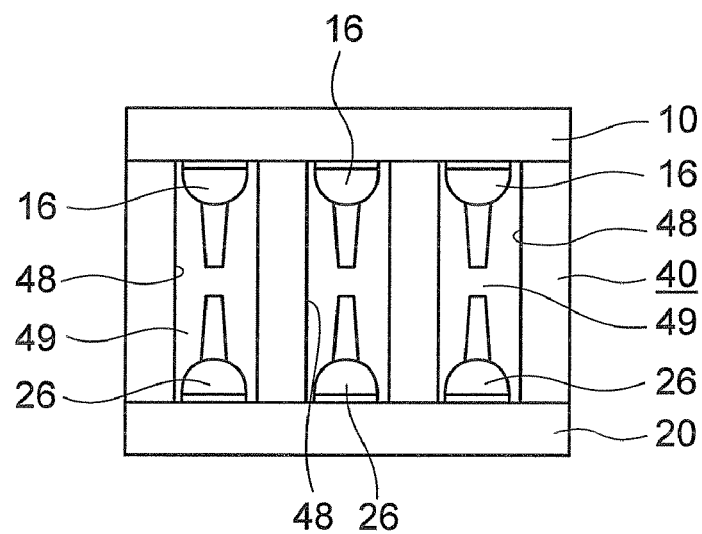
FIG. 15 is a cross-sectional view taken along a line XV-XV in FIG. 14.

As means for connecting the first substrate 10 and the second substrate 20 electrically, for example, a through hole 46 is formed in the intermediate member 40. Moreover, an electroconductive member 47 is formed inside the through hole 46 (FIG. 12 and FIG. 13), or, a groove 48 is formed in the intermediate member 40, and an electroconductive member 49 is formed in the groove 48 (FIG. 14 and FIG. 15). In these cases, for reinforcing a joint of the electroconductive member 47 (electroconductive member 49) and the first substrate 10, and the electroconductive member 47 (electroconductive member 49) and the second substrate 20, it is preferable to form protruding electrodes 16 and 26 on the first substrate 10 and the second substrate 20 respectively (FIG. 13 and FIG. 15).

Figure 12:
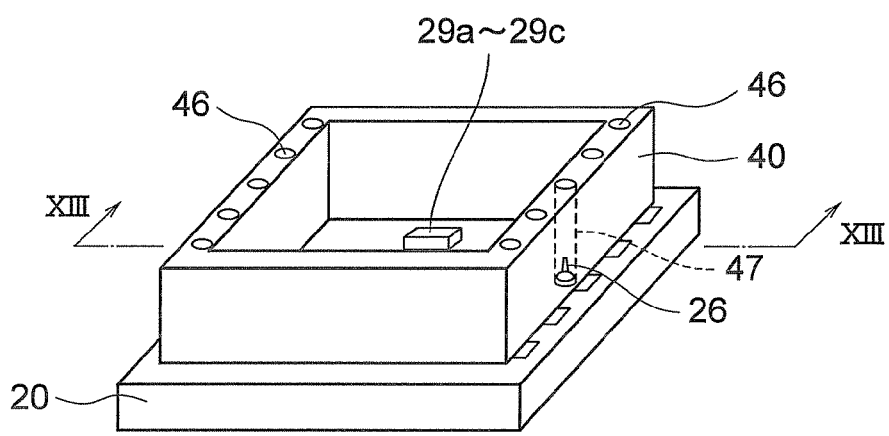
FIG. 12 is a perspective view showing a structure of an electroconductive member and a through hole formed in the intermediate member.

Here, FIG. 12 is a perspective view showing a structure in which, the through hole 46 is formed in the intermediate member 40 and the electroconductive member 47 is formed in the through hole 46. FIG. 13 is a cross-sectional view taken along a line XIII-XIII in FIG. 12. Moreover, FIG. 14 is a perspective view showing a structure in which, the groove 48 is formed in the intermediate member 40, and the electroconductive member 49 is formed in the groove 48, and FIG. 15 is a cross-sectional view taken along a line XV-XV in FIG. 14.

Figure 10:
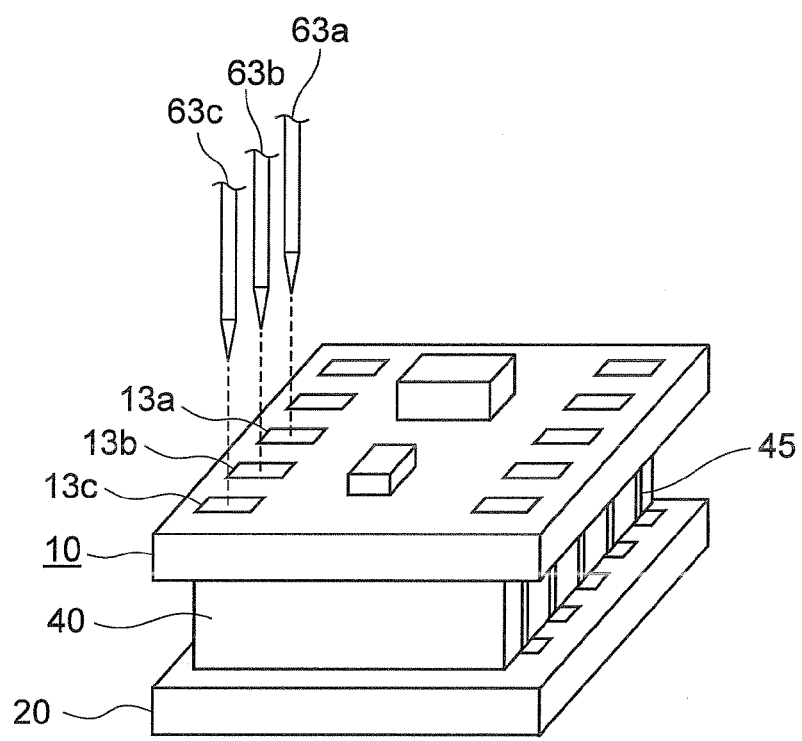
FIG. 10 is a perspective view showing a relationship of the probes for testing and the stacked mounting structure at the time of testing the overall stacked mounting structure after manufacturing.

Testing of each substrate having the above-mentioned structure is carried out as follows. Firstly, after the formation of the stacked mounting structure 100, by bringing the probes for testing 61a and 62b in contact with the first electrodes for testing 11a and 11b formed on the substrate 10, checking of the operation of the first substrate 10 on which the electronic components 19a, 19b, and 19c are mounted, is carried out (FIG. 8). Moreover, after the formation of the stacked mounting structure 100, by bringing the probes for testing 62a and 62b in contact with the second electrodes for testing 12a and 12b formed on the first substrate 10, checking of the operation of the second substrate 20 on which the electronic components 29a, 29b, and 29c are mounted, is carried out (FIG. 9). Furthermore, after the formation of the stacked mounting structure 100, by bringing the probes for testing 63a, 63b, and 63c in contact with the electrodes for testing the stacked mounting structure 13a, 13b, and 13c formed on the first substrate 10, checking of the operation of the stacked mounting structure is carried out (FIG. 10).

In the first embodiment, although an example of a two-layered substrate is shown, it may be a stacked mounting structure in which three or more substrates are stacked (FIG. 11), and the testing of each substrate can be carried out by disposing the testing electrodes similarly.

According to the first embodiment, testing of each substrate even after the formation of (after manufacturing) the stacked mounting structure 100 becomes possible, and accordingly, the following effects are shown.

(1) It is possible to identify a location of a defect in the substrates after the formation of the stacked mounting structure 100, and an improvement in quality can be anticipated.

(2) Since it is not necessary to keep the electrode for testing the second substrate 20 to be exposed to outside, a degree of freedom of designing is widened, and also, a small-sizing of the stacked mounting structure 100 becomes possible.

Second Embodiment

Figure 16:
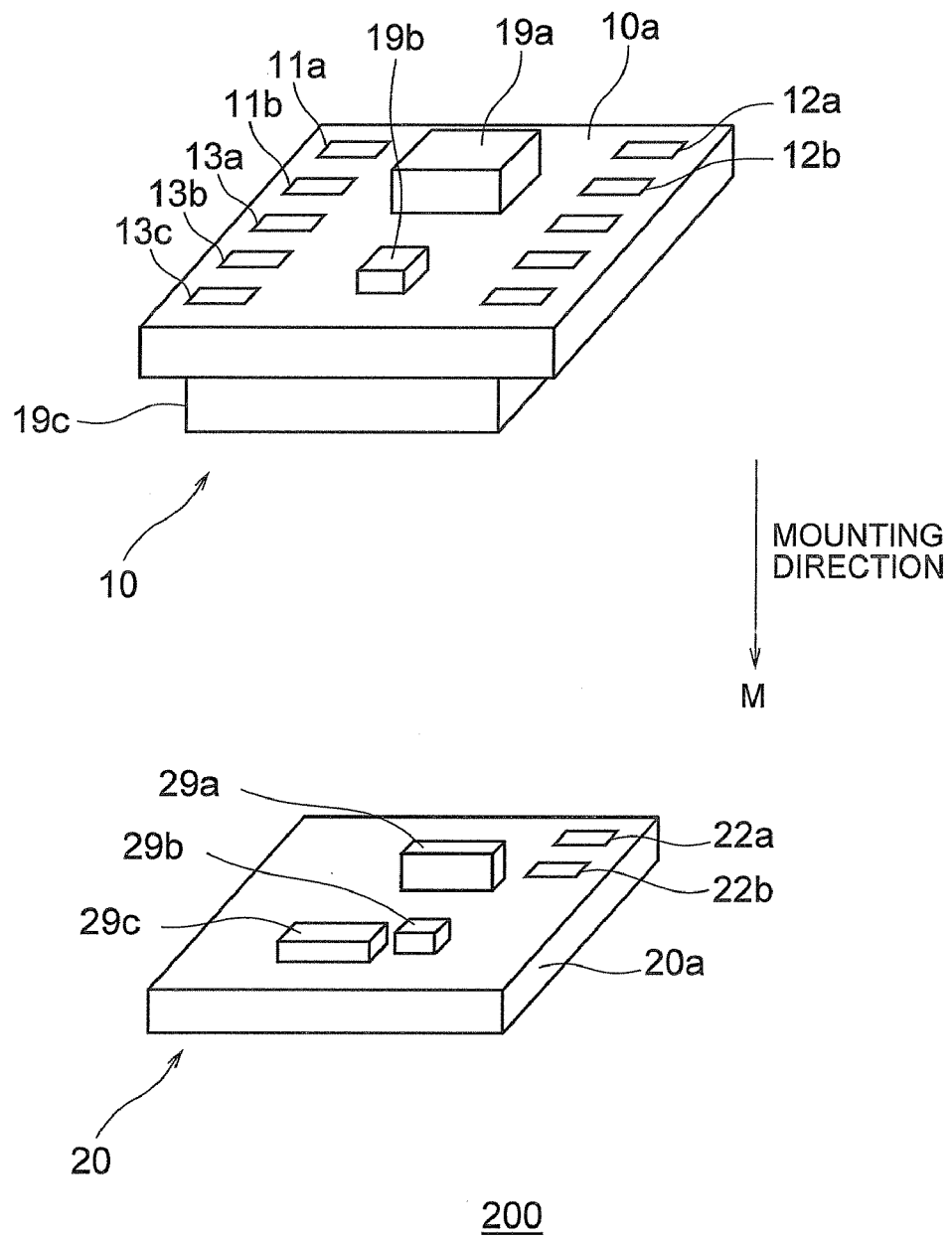
FIG. 16 is an exploded perspective view showing a structure of a stacked mounting structure according to a second embodiment.

A stacked mounting structure 200 according to a second embodiment will be described below while referring to FIG. 16. Here, FIG. 16 is a perspective view showing a structure of the stacked mounting structure 200, and same reference numerals are used for members which are same as the members in the stacked mounting structure 100 according to the first embodiment. Moreover, even in the stacked mounting structure 200 according to the second embodiment, an intermediate member is disposed between the first substrate 10 and the second substrate 20 similarly as in the stacked mounting structure, but the intermediate member is not shown in FIG. 16.

The stacked mounting structure 200 according to the second embodiment, as compared to the stacked mounting structure 100 according to the first embodiment, differs at the following points.

(1) The first electrodes for testing 11a and 11b are provided on the first substrate 10.

(2) The connecting electrodes toward the second substrate 22a and 22b are provided on the second substrate 20.

(3) The second electrodes for testing 12a and 12b are provided on the first substrate 10.

(4) The electrodes for testing the stacked mounting structure 13a, 13b, and 13C which are provided on the first substrate 10 are provided to be directed toward one surface (a surface 10a opposite to a mounting surface 20a in the stacked mounting structure 200). Here, a mounting direction M of the stacked mounting structure 200 is a downward direction in FIG. 16.

According to the stacked mounting structure 20 according to the second embodiment, the probes for testing can make an access from one direction. Moreover, since the electrodes for testing are provided on the surface 10a opposite to the mounting surface 20a, the probes for testing can make an access in a direction (mounting direction M) perpendicular to the first substrate 10. Therefore, according to the stacked mounting structure 200 according to the second embodiment, the testing becomes easy, and shortening of the testing time can be anticipated. Moreover, since the probes for testing can make access in the mounting direction, it is possible to reduce a risk of damaging the stacked mounting structure.

Third Embodiment

Figure 17:
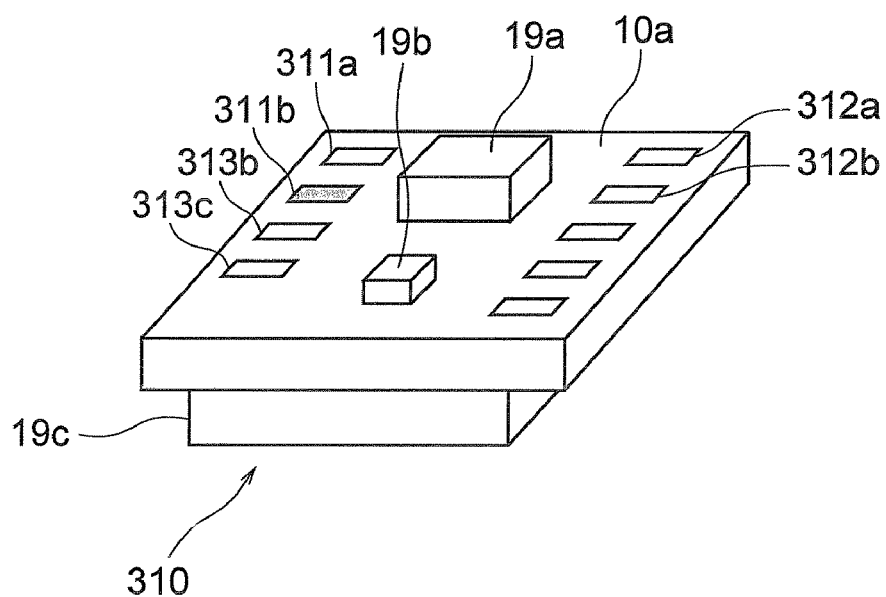
FIG. 17 is a perspective view showing a structure of a first substrate according to a third embodiment.
Figure 18:
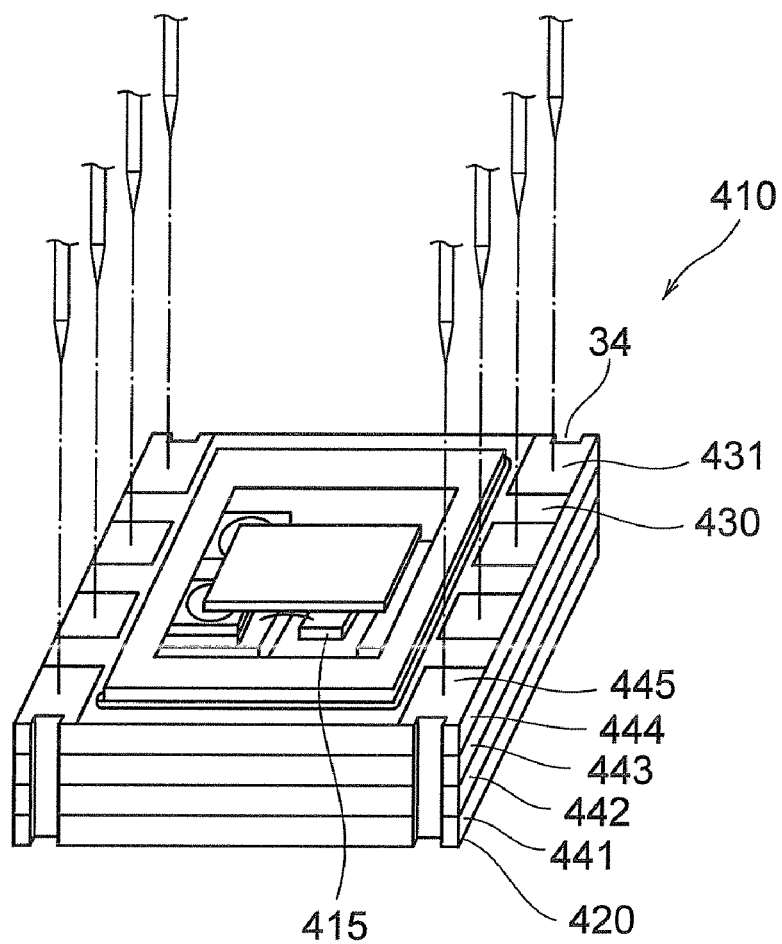
FIG. 18 is a perspective view showing a structure of a conventional stacked mounting structure.

A stacked mounting structure according to a third embodiment will be described below while referring to FIG. 17. Here, FIG. 17 is a perspective view showing a structure of a first substrate of the stacked mounting structure according to the third embodiment, and same reference numerals are used for members which are same as the members in the first substrate 10 according to the first embodiment. Moreover, even in the stacked mounting structure according to the third embodiment, the second substrate 10 and an intermediate member similarly as in the stacked mounting structure 100 according to the first embodiment are used.

The stacked mounting structure according to the third embodiment, as compared to the stacked mounting structures according to the first embodiment and the second embodiment, differs at a point that a first electrode for testing 311b which tests a first substrate 310 also serves as one first electrode for testing which tests the stacked mounting structure. The electrodes for testing other than this first electrode for testing 311b is similar as the electrodes for testing in the first substrate 10 according to the first embodiment. In other words, the first electrode for testing 311a, second electrodes for testing 312a and 312b, and third electrodes for testing 313b and 313c correspond to the first electrode for testing 11a, the second electrodes for testing 12a and 12b, and the third electrodes for testing 13b and 13c respectively.

According to the stacked mounting structure according to the third embodiment, since it is possible to use the plurality of electrodes for testing as one electrode for testing, it is possible to reduce the number of probes for testing, and the testing becomes easy and small-sizing of the stacked mounting structure becomes possible.

Furthermore, when the first electrode for testing 311b which serves as an electrode for testing which tests the first substrate 310 and an electrode for testing which tests the stacked mounting structure 100 is let to be a ground terminal, a power supply terminal, or a signal line, it is possible to form the ground, a power supply line, or the signal line which are separated (isolated) by one ground pattern. Therefore, the ground, the power supply line, or the signal line can be anticipated to be electrically stabilized.

INDUSTRIAL APPLICABILITY

As it has been described above, the stacked mounting structure according to the present invention it useful for testing a structure in which a plurality of substrates having electronic components mounted thereon, are stacked, and particularly, is suitable for an endoscope, a cellular telephone, and other electronic equipments.

The invention claimed is:

1. A stacked mounting structure comprising:
a first substrate which includes a first electronic component;
a second substrate which is disposed facing the first substrate, and which includes a second electronic component;
an intermediate member which is installed between the first substrate and the second substrate, and which connects the first substrate and the second substrate, leaving a predetermined distance, and which has a space for accommodating the second electronic component;
an electroconductive member which is provided to the intermediate member;
a first electrode for testing which is an electrode which is provided to the first substrate, as an electrode for testing an operation of the first electronic component, and which is electrically connected to the first electronic component;
a connecting electrode toward the second substrate which is provided to the second substrate, as an electrode for electrically connecting to the electroconductive member, and which is electrically connected to the second electronic component; and
a second electrode for testing which is an electrode which is provided to the first substrate, as an electrode for testing an operation of the second electronic component, and which is electrically connected to the second electronic component via the electroconductive member and the connecting electrode toward the second substrate.

2. The stacked mounting structure according to claim 1, wherein the connecting electrode toward the second substrate, in a state of the second substrate not connected to the intermediate member, functions as an electrode for testing an operation of the second component.

3. The stacked mounting structure according to claim 1, wherein the first substrate includes a third electrode for testing which is electrically connected to the first electronic component, the second electronic component, and all other electronic components, as an electrode for testing an operation of the first electronic component, the second electronic component, and all other electronic components.

4. The stacked mounting structure according to claim 1, wherein the first electrode for testing and the second electrode for testing are provided on one surface of the first substrate.

5. The stacked mounting structure according to claim 4, wherein the third electrode for testing is provided on a same surface as the one surface of the first substrate.

6. The stacked mounting structure according to claim 4, wherein one surface of the first substrate is a surface which is positioned on an opposite side of a surface facing the second substrate.

7. The stacked mounting structure according to claim 1, comprising:
a connecting electrode toward the first substrate which is an electrode provided to a surface of the first substrate facing the intermediate member, as an electrode for electrically connecting to the electroconductive member, wherein
one end portion of the electroconductive member makes a direct contact with the connecting electrode toward the first substrate, and the other end portion of the electroconductive member makes a direct contact with the connecting electrode toward the second substrate.

8. The stacked mounting structure according to claim 1, wherein the electroconductive member is provided inside a through hole which is formed in the intermediate member.

9. The stacked mounting structure according to claim 1, wherein the electroconductive member is provided inside a recess which is formed in the intermediate member.

10. The stacked mounting structure according to one of claims 1 to 9, wherein each electrode for testing is made of a plurality of electrodes, and at least one of the predetermined electrodes for testing serves also a function of at least one of the other electrodes for testing.

11. The stacked mounting structure according to claim 10, wherein the electrodes for testing which serve the same function are used as a ground terminal, a power supply terminal, or a signal-line terminal.

12. The stacked mounting structure according to claim 10, wherein all electrodes for testing have the same area.

* * * * *